(12) United States Patent
Tominaga et al.

(10) Patent No.: US 9,129,673 B2
(45) Date of Patent: Sep. 8, 2015

(54) SUPERLATTICE RECORDING LAYER FOR A PHASE CHANGE MEMORY

(75) Inventors: Junji Tominaga, Tsukuba (JP); Paul Fons, Tsukuba (JP); Alexander Kolobov, Tsukuba (JP)

(73) Assignee: NATIONAL INSTITUTE OF ADVANCED INDUSTRIAL SCIENCE AND TECHNOLOGY, Chiyoda-Ku, Tokyo (JP)

( * ) Notice: Subject to any disclaimer, the term of this patent is extended or adjusted under 35 U.S.C. 154(b) by 1042 days.

(21) Appl. No.: 13/138,545

(22) PCT Filed: Feb. 24, 2010

(86) PCT No.: PCT/JP2010/052860
§ 371 (c)(1),
(2), (4) Date: Sep. 1, 2011

(87) PCT Pub. No.: WO2010/101055
PCT Pub. Date: Sep. 10, 2010

(65) Prior Publication Data
US 2011/0315942 A1  Dec. 29, 2011

(30) Foreign Application Priority Data

Mar. 4, 2009  (JP) ................................ 2009-051072

(51) Int. Cl.
*H01L 45/00* (2006.01)
*G11C 13/00* (2006.01)
(52) U.S. Cl.
CPC .......... *G11C 13/0004* (2013.01); *H01L 45/065* (2013.01); *H01L 45/1233* (2013.01); *H01L 45/148* (2013.01); *H01L 45/1625* (2013.01)

(58) Field of Classification Search
USPC .............................................. 257/2, E45.002
See application file for complete search history.

(56) References Cited

U.S. PATENT DOCUMENTS 8,530,314 B2 *  9/2013  Tominaga et al. ............ 438/287
2002/0131309 A1  9/2002  Nishihara et al.
(Continued)

FOREIGN PATENT DOCUMENTS

JP  2002-203392 A  7/2002
JP  2003-298013     10/2003  .............. H01L 27/10
(Continued)

OTHER PUBLICATIONS

Chong et al.; Superlattice-like structure for phase change optical recording; Apr. 1, 2002; Journal of Applied Physics; vol. 91, No. 7; pp. 3981-3987.*

(Continued)

*Primary Examiner* — Marcos D Pizarro
(74) *Attorney, Agent, or Firm* — Harness, Dickey & Pierce P.L.C.

(57) ABSTRACT

A solid-state memory that requires a lower current during recording and erasing data and can repeatedly rewrite data an increased number of times. In at least one example embodiment, the solid-state memory includes a recording layer that includes a laminated structure in which electric properties are changed in response to a phase separation. The laminated structure includes a film containing an Sb atom(s) and a film containing a Ge atom(s), which films constitute a superlattice structure. In the laminated structure, phase separation of the film containing the Sb atom and the film containing the Ge atom allows data to be recorded and erased efficiently.

8 Claims, 4 Drawing Sheets

(56) References Cited

U.S. PATENT DOCUMENTS

| | | | |
|---|---|---|---|
| 2006/0087921 A1 | 4/2006 | Iwasaki | 369/13.01 |
| 2008/0001136 A1* | 1/2008 | Chong et al. | 257/4 |
| 2010/0200828 A1* | 8/2010 | Tominaga et al. | 257/2 |
| 2010/0207090 A1* | 8/2010 | Tominaga et al. | 257/2 |

FOREIGN PATENT DOCUMENTS

| | | | |
|---|---|---|---|
| JP | 2006-120810 | 5/2006 | H01L 27/105 |
| WO | WO-2009-028249 A1 | 3/2009 | |
| WO | WO-2009-028250 A1 | 3/2009 | |
| WO | WO-2010-050117 A1 | 5/2010 | |
| WO | WO-2010-050118 A1 | 5/2010 | |

OTHER PUBLICATIONS

Cabral et al, "Direct evidence for abrupt postcrystallization germanium precipitation in thin phase-change films of Sb-15 at. % Ge", Applied Physics Letters, Aug. 22, 2008, vol. 93, 071906.

Kolobov et al, "Laser-induced Ge Atom Switching as a Key to Understanding Phase-change Optical Media", CLEO/Pacific Rim 2005. Pacific Rim conference on Lasers and Electro-Optics, 2005, Aug. 2005, p. 102-103.

Siegel et al., "Dynamics of ultrafast reversible phase transitions in GeSb films triggered by picosecond laser pulses", Applied Physics Letters, Nov. 15, 1999, vol. 75, No. 20, p. 3102-3104.

Chong et al., "Superlattice-like structure for phase change optical recording, Journal of Applied Physics", Apr. 1, 2002, vol. 91, No. 7, p. 3981-39.

Tsunoda, Yoshito, "Basis and Application of Optical Disc Storage", Institute of Electronics, Information and Communication Engineers, Jun. 1, 2001, p. 204-209.

Okuda, Masahiro, editor, "Technology and Materials for Future Optical Memories" 1st edition, CMC publishing Co. Ltd., Jan. 31, 2004, p. 109-120.

Yamada et al., "Structure of laser-crystallized $Ge_2Sb_{2+x}Te_5$ sputtered thin films for use in optical memory", Journal of Applied Physics, vol. 88, No. 12, p. 7020-7028.

Kolobov et al. "Understanding the phase-change mechanism of rewritable optical media", Nature Materials, Sep. 12, 2004, vol. 3, p. 703-708.

Raoux et al., "Phase-change random access memory: A scalable technology", IBM Journal of Research and Development, vol. 52, No. 4/5, p. 465-479.

International Search Report.

* cited by examiner

SUPERLATTICE RECORDING LAYER FOR A PHASE CHANGE MEMORY

TECHNICAL FIELD

The present invention relates to a solid-state memory in which a difference in electric properties is recorded or erased as data.

BACKGROUND ART

PRAMs (phase-change Random Access Memories) have been conventionally studied in order to accomplish an ultra-high-density memory. Recording or erasing of data is carried out with respect to the PRAMs by use of a physical property change caused by a transition (called $1^{st}$-order phase transformation) between a crystalline state and an amorphous state of chalcogen compounds containing Te (see, for example, Patent Literature 1 and Non patent Literatures 1 and 2).

An alloy thin film has been usually employed as a recording material for the PRAMs. The alloy thin film has a single layer and is deposited between electrodes by a vacuum film deposition method such as sputtering with the use of a target made from a compound composition. Because of this, the alloy thin film has a thickness of 20 nm to 50 nm and is a polycrystal, not a single crystal.

Since the latter half of the 1980s, chalcogen compounds that contain Te have been studied as to their crystal structures and amorphous structures by structure analysis using an X-ray and/or the like. Note, however, that the crystal structures of the chalcogen compounds had been unclear until 2004. This is because of the presence of Sb. Sb is one of the atoms constituting the chalcogen compound containing Te, and has the atomic number next to Te, so that the difference in the number of electrons is only one (1) between Sb and Te. This makes it almost impossible to distinguish between Te and Sb by use of the X-ray diffraction or the electron diffraction.

This caused misunderstandings as to crystal structures of (i) a compound called GeSbTe (225 composition), which has been experimentally known to have excellent properties and (ii) compounds similar to a pseudo-binary composition compound (i.e., compounds, having 225, 147, or 125 composition, similar to GeTe—$Sb_2Te_3$), which compounds (i) and (ii) are and used in rewritable optical discs which have been already on the market and have been used in rewritable optical disks. Specifically, it had been believed that the crystal structures of the compounds (i) and (ii) had sodium-chloride structures in each of which Te occupies Na sites (a-sites) and Ge or Sb occupies Cl sites (b-sites) randomly (see, for example, Non patent Literature 3).

However, the structure of the GeSbTe compound was analyzed in detail by use of a device such as a synchrotron orbital radiation device. This has revealed that the chalcogen compound that contains Te has a structure different from the structures that had been believed in the following respects (see, for example, Non patent Literature 4).

Specifically, the following facts (1) through (3) came out. (1) In a crystal phase, an arrangement in which Ge atoms and Sb atoms occupy positions ((b)-sites) of Cl in a NaCl-type simple cubic lattice is not a 'random' state as previously believed. Instead, positions at which the atoms are arranged are precisely 'fixed' and the lattice is distorted (see FIG. 3). (2) The amorphous state is not completely random but has a twisted structure, while maintaining a unit, in which Ge atoms inside the crystal lattice are arranged so as to be slightly shifted by about 0.2 Å from the central position toward Te atoms, which central position is slightly off the center and is therefore ferroelectric (see FIG. 4). (3) The unit thus twisted is restored, so that high-speed switching is stably repeated (see FIG. 5).

Figure 3:
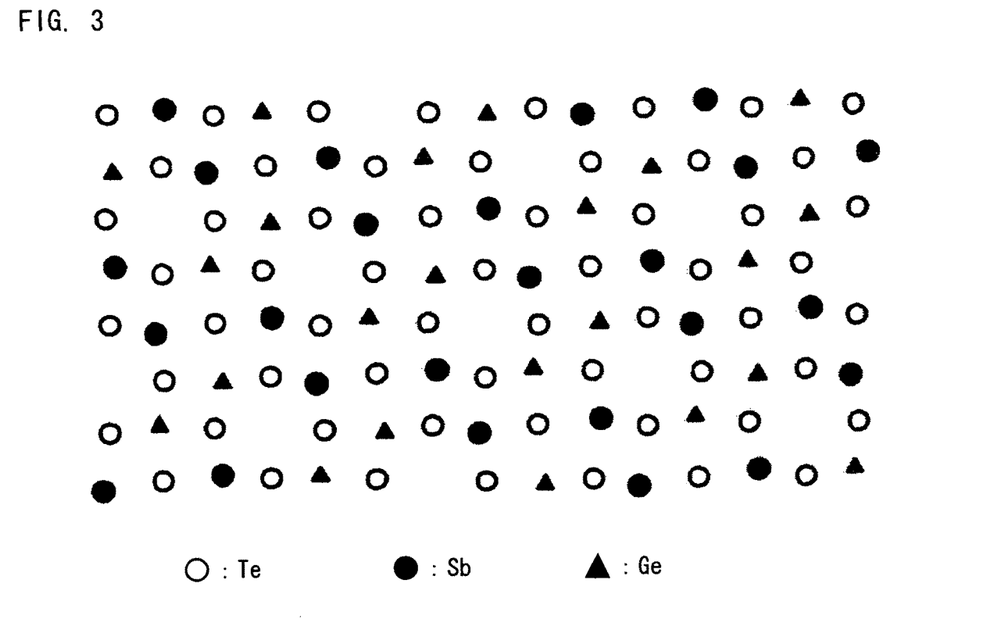
FIG. 3 is a plan view schematically illustrating an example of a crystal structure of a Ge—Sb—Te alloy in a conventional solid-state memory.
Figure 4:
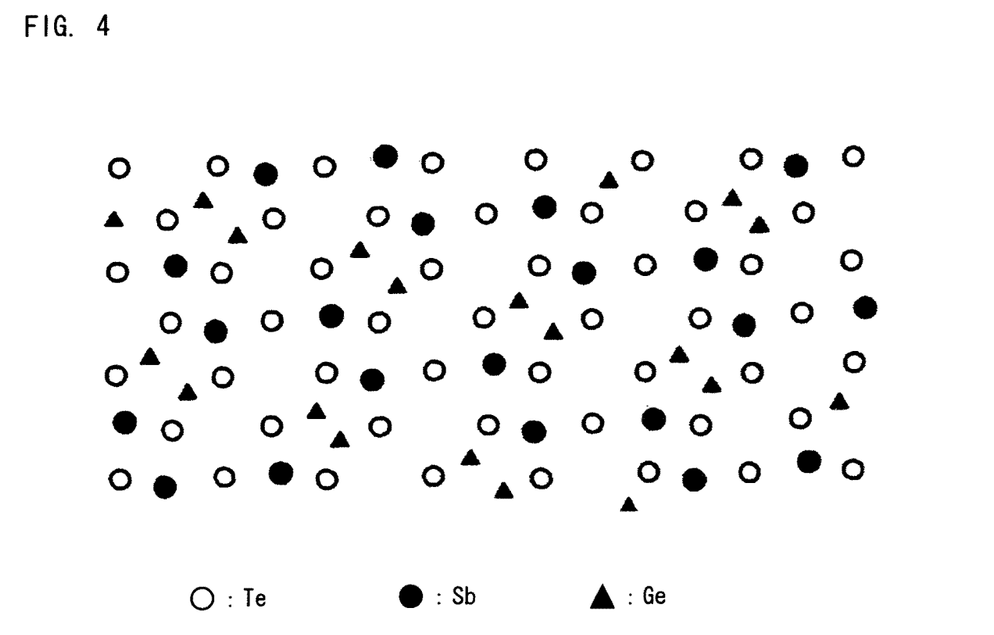
FIG. 4 is a plan view schematically illustrating an example of an amorphous structure of a Ge—Sb—Te alloy in a conventional solid-state memory.
Figure 5:
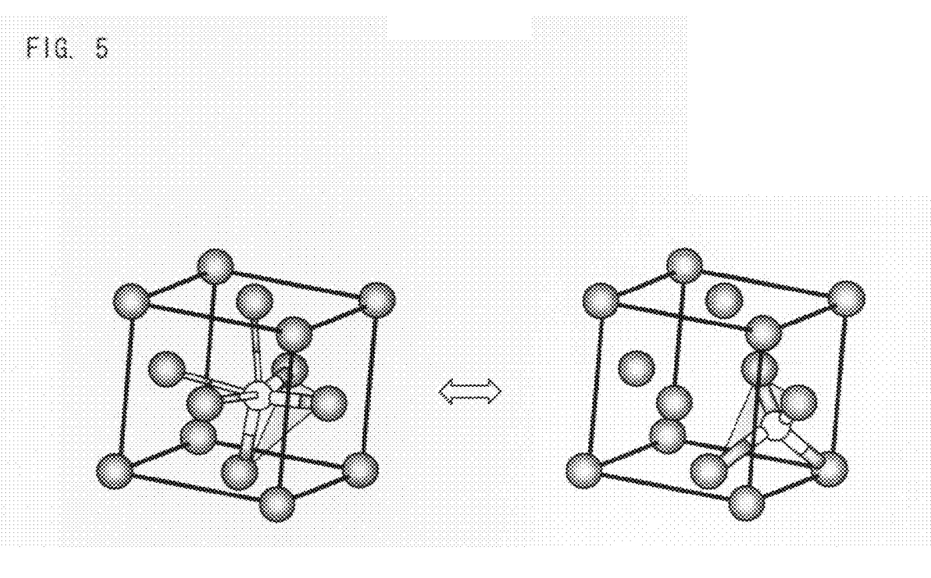
FIG. 5 is a perspective view schematically illustrating high-speed switching in a Ge—Sb—Te alloy in a conventional solid-state memory.

Note in FIG. 5 that (i) the structure illustrated on the left side corresponds to the structure illustrated in FIG. 3 and (ii) the structure illustrated on the right side corresponds to the structure illustrated in FIG. 4.

Note also that a phase-change material constituted by Ge and Sb without using Te has been recently developed (see, for example, Non patent Literature 5).

CITATION LIST

Patent Literature

Patent Literature 1
Japanese Patent Application Publication, Tokukai, No. 2002-203392 A (Publication Date: Jul. 19, 2002)

Non patent Literature

Non patent Literature 1
Masahiro OKUDA, "Technology and Materials for Future Optical Memories", CMC Publishing Co., Ltd., 2004,01,31, p. 114
Non patent Literature 2
Yoshito TSUNODA, "Basics and Applications of Optical Disk Storage", The Institute of Electronics, Information and Communication Engineers (IEICE) ed., the third impression of the first edition, 2001.6.1, p. 209
Non patent Literature 3
N. Yamada T. Matsunaga, Journal of Applied Physics, 88, (2000) pp. 7020-7028
Non patent Literature 4
A. Kolobov et al. Nature Materials 3 (2004) p. 703
Non patent Literature 5
S. Raoux, G. W. Burr, M. J. Breitwisch, C. T. Rettner, Y. C. Chen, R. M. Shelby, M. Salinga, D. Krebs, S. H. Chen, H. L. Lung, C. H. Lam, IBM J. Res. 86 Dev. 52, (2008) pp. 465-479

SUMMARY OF INVENTION

Technical Problem

However, there is a demand for a solid-state memory that requires a lower current during recording and erasing data and is capable of repeatedly rewriting data an increased number of times.

A major factor of limitation on the number of rewriting of data in the conventional configuration is considered to be thermal material flow of a recording film at a high temperature and subsequent deformation of the entire recording film (see, for example, Non patent Literature 5).

The present invention is accomplished in view of the problem. An object of the present invention is to provide a solid-state memory that requires a lower current during recording and erasing of data and is capable of repeatedly rewrite data an increased number of times.

Solution to Problem

The inventors of the present invention diligently studied to attain the object. Specifically, the inventors had the following idea.

As described above, according to the conventional PRAM, recording or erasing of data is carried out on the basis of the physical property change caused by the $1^{st}$-order phase transformation between the crystal state and the amorphous state. Since the recording thin film is not a single crystal but a polycrystal, a difference in interface electric resistance among micro crystallites affects uniformity of overall electric resistance. This causes a nonuniform resistance in the crystal state. This ultimately causes a higher current to be required during recording and erasing of data.

The inventors also had the following idea. In the conventional PRAMs, micro crystallites are caused to generate respective different stresses by a volume change that is caused during a phase transition in a $1^{st}$-order phase transformation between a crystal state and an amorphous state. This results in a flow of substances and a deformation of the entire film. Consequently, the number of rewriting is limited.

In order to address the problem, the inventors paid attention to a phase-change material that contains Ge and Sb but no Te. Up to then, the principle of a phase change of the phase-change material that contains Ge and Sb but no Te had been unclear. The inventors applied a model of an alloy that contains Ge, Sb, and Te as main constituent elements to an alloy that contains Ge and Sb as main constituent elements but does not contain Te, and analyzed the latter alloy in detail through experiments and computer simulations.

As a result, the inventors found that, in a compound that contained Ge, Sb, and Te as main constituent elements, Ge atoms changed their positions as illustrated in FIG. 3 or 4 so that a recorded state or an erased state was is achieved, and found that, in a compound that contained Ge and Sb as main constituent elements but does not contain Te, a slight inter-layer separation between a Ge layer and an Sb layer caused significant changes in optical characteristics and in electric properties.

By utilizing such a newly found switching mechanism that is caused by the inter-layer separation, the inventors have achieved a novel phase-separation RAM that can (i) reduce an interface electric resistance between micro crystallites and (ii) increase the number of repeatable rewriting even in a case of a compound that does not contain a chalcogen compound.

That is, the solid-state memory of the present invention is a solid-state memory whose feature resides in including a recording layer in which data is recorded or erased, the recording layer including a laminated structure in which electric properties are changed in accordance with a phase separation, the laminated structure including a first layer containing an Sb atom(s) and a second layer containing a Ge atom(s), which layers are laminated so as to constitute a superlattice structure.

With the configuration, the recording layer has a structure in which a film (an Sb layer) containing the Sb atom(s) and a film (a Ge layer) containing the Ge atom(s) are bound to each other through weak atomic bond. If, in this structure, the atomic bond is cut off in an inter-layer direction between the Sb layer and the Ge layer in response to electric energy, then an electrically high resistance state is formed and fixed in the recording layer. This causes a recorded (erased) state to be achieved.

In contrast, if the atomic bond is restored in response to electric energy, an electrically low resistance state is restored. This causes a erased (recorded) state to be achieved.

That is, switching of inter-layer separation of the Sb layer and the Ge layer is made in the recording layer in response to electric energy. The switching allows data to be recorded or erased.

Note that, in the recording layer, the inter-layer separation of the Sb layer and the Ge layer causes a phase separation (spinodal separation) of substances that constitute the recording layer.

With the configuration, since the Sb layers and the Ge layers constitute a superlattice structure, the directions, in which the inter-layer separations occur between reading and erasing data, are identical to each other. Because of this, electric energy that is supplied to cut off inter-layer bond has coherency. This causes a great reduction in entropic energy loss. As such, it is possible to utilize large portion of supplied energy for cutting the inter-layer bond, and it is therefore possible to reduce an amount of energy emission which is emitted as heat. In other words, it becomes possible to perform rewrite at a lower temperature.

Further, the reduction in the entropic energy loss in the input energy allows a reduction in a change in a volume of the recording layer, during rewriting operation. Thus, it becomes possible to realize stable repetitive rewrite operations without generating compositional segregation.

Therefore, with this configuration, it is possible to provide a solid-state memory that requires a lower current for recording and erasing data and that can repeatedly rewrite data an increased number of times.

Further, in the solid-state memory according to the present invention, the first layer and the second layer are preferably provided adjacent to each other in the laminated structure.

With the configuration, it is possible to provide a solid-state memory that requires a lower current during recording and erasing of data.

Further, in the solid-state memory according to the present invention, a ratio of a film thickness of the second layer to a film thickness of the first layer is preferably in a range of 1:20 to 1:3.

With the configuration, it is possible to significantly increase the number of repeatable rewriting and to improve thermal durability so that the recorded (erased) state is stabilized against an external temperature change.

Further, it is preferable that the solid-state memory of the present invention further include electrodes provided above and below the recording layer, the data being recorded or erased by causing an electric pulse to be applied to the recording layer via the electrodes so that a volume of the recording layer is changed at a volume change rate of 5% or less in a vertical direction.

The volume change rate is a value obtained by first-principle calculation.

According to a conventional solid-state memory, a volume of the recording material changes at a change rate of about 10% during a phase transition in the $1^{st}$-order phase transformation between a crystal state and an amorphous state. Further, a direction in which the volume change occurs is not fixed.

In contrast, according to the solid-state memory of the present invention, the data is recorded or erased by changing the volume of the recording layer at a change rate of 5% or less which is a change rate surely lower than that in the conventional solid-state memory. Further, the volume of the recording layer is changed only in a single axial direction, that is, in the vertical direction of the recording layer. According to the present configuration, it is possible to realize stable repetitive rewriting operations with less occurrence of the compositional segregation generation.

Further, in the solid-state memory of the present invention, the second layer is preferably constituted by an atomic layer having five or less Ge atoms, and the first layer is preferably constituted by an atomic layer having an odd number of Sb atom(s).

If the Ge layer is constituted by an atomic layer having more than 5 Ge atoms, the superlattice structure constituted by the Ge layer and the Sb layer cannot stably maintain the hexagonal crystal. This causes a reduction in the number of repeatable recording and erasing operations. If an Sb layer is constituted by an atomic layer that has an even number of Sb atoms, then it is likely that (i) a difference becomes small between electric resistance values obtained before and after the phase separation or (ii) the electric resistances obtained before and after the phase separation become reversed in magnitude. Such an Sb layer is not desirable as a function for a memory.

Therefore, with the configuration, it becomes possible to provide a solid-state memory that can increase the number of repeatable rewriting and that can stably record or erase data.

Advantageous Effects of Invention

The solid-state memory of the present invention includes the recording layer that includes the laminated structure in which the electrical properties are changed in response to a phase separation, the laminated structure including the film containing the Sb atom(s) and the film containing the Ge atom(s), which films constitute the superlattice structure. The configuration brings about an effect of (i) reducing a current required for recording and erasing the data and (ii) being capable of repeatedly rewriting the data an increased number of times.

BRIEF DESCRIPTION OF DRAWINGS

FIG. 1

FIG. 2

FIG. 3

FIG. 4

FIG. 5

DESCRIPTION OF EMBODIMENTS

An embodiment of the present invention will be described below in detail.

A solid-state memory in accordance with the present embodiment of the present invention is a solid-state memory including a recording layer in which data is recorded or erased. The recording layer has a laminated structure in which an electric property is changed in response to a phase separation. In the laminated structure, a layer containing an Sb atom(s) and a layer containing a Ge atom(s) are laminated so as to constitute a superlattice structure.

Here, the wording 'superlattice' denotes a crystal lattice that has a periodic structure longer than that of a basic unit lattice. The superlattice is achieved by superposing a plurality of types of crystal lattices on each other. The wording 'superlattice structure' denotes a structure having such a crystal lattice.

The wording 'phase separation' denotes that a compound is changed into a binary or more mixture phase by breaking a chemical bond.

The 'recording layer' is constituted by a data recording and reproducing material. In the recording layer, the layer containing the Sb atom(s) and the layer containing the Ge atom(s) are laminated on each other so as to form a superlattice structure.

As for the lamination, it is only necessary that the layer containing the Sb atom(s) and the layer containing the Ge atom(s) are laminated adjacent to each other. For example, a structure in which an atomic layer containing one (1) Ge atom and an atomic layer containing five Sb atoms are alternately laminated can be called the superlattice. Alternatively, a set, which is made up of three layers obtained by combining at least one layer containing an Sb atom(s) and at least one layer containing a Ge atom(s), can be repeatedly laminated.

The 'layer containing an Sb atom(s)' is preferably composed of a compound containing at least 95% Sb. The 'layer containing a Ge atom(s)' is preferably composed of a compound containing at least 95% Ge.

Specifically, the 'layer containing an Sb atom(s)' can be a Sb simple substance film or an alloy film containing an Sb atom(s). Likewise, the 'layer containing a Ge atom(s)' can be a Ge simple substance film or an alloy film containing a Ge atom.

For example, the layer containing a Ge atom(s) is preferably an atomic layer having five or less Ge atoms, and the layer containing an Sb atom(s) is preferably an atomic layer having an odd number of Sb atom(s). This allows the superlattice structure to stably maintain a hexagonal crystal. As such, the number of repeatable recording and erasing operations is increased. It is further possible to ensure a proper difference between electric resistances obtained before and after the phase separation. This allows the data to be stably recorded and erased.

A compound containing Sb, such as SbTi, SbBi, or SbAs, can be used as the alloy film containing an Sb atom(s). The alloy film containing an Sb atom(s) can contain a Te atom(s) or can contain no Te atom. A compound containing Ge, such as GeTi, GeSi, GeC, or GeAl, can be used as the alloy film containing a Ge atom(s). Note that the alloy film containing a Ge atom(s) contains no Te atom.

Unless otherwise specifically noted, the layer containing an Sb atom(s) will be hereinafter referred to as an Sb layer, and the layer containing a Ge atom(s) will be hereinafter referred to as a Ge layer.

Figure 1:
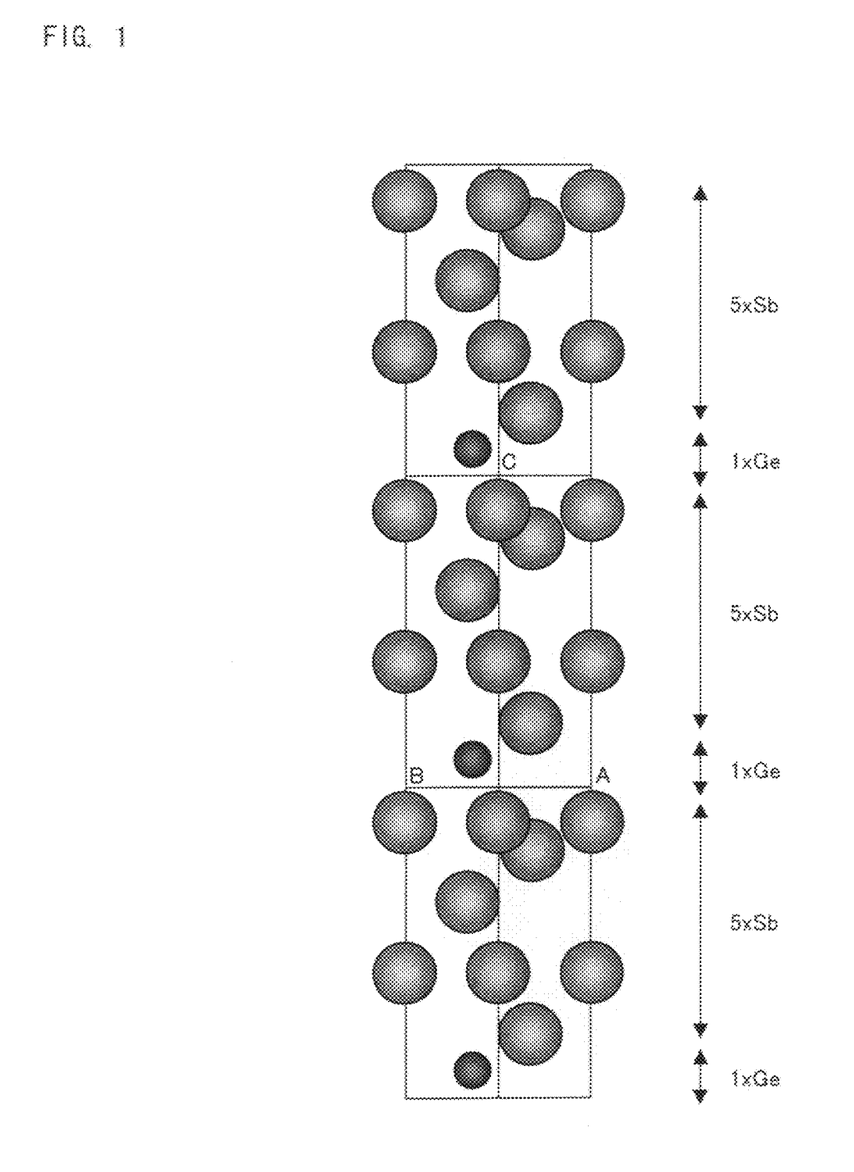
FIG. 1 is a view of a superlattice structure constituted by Ge/$Sb_5$ in accordance with an embodiment of the present invention, the view illustrating the superlattice structure which has not been subjected to a phase separation.
Figure 2:
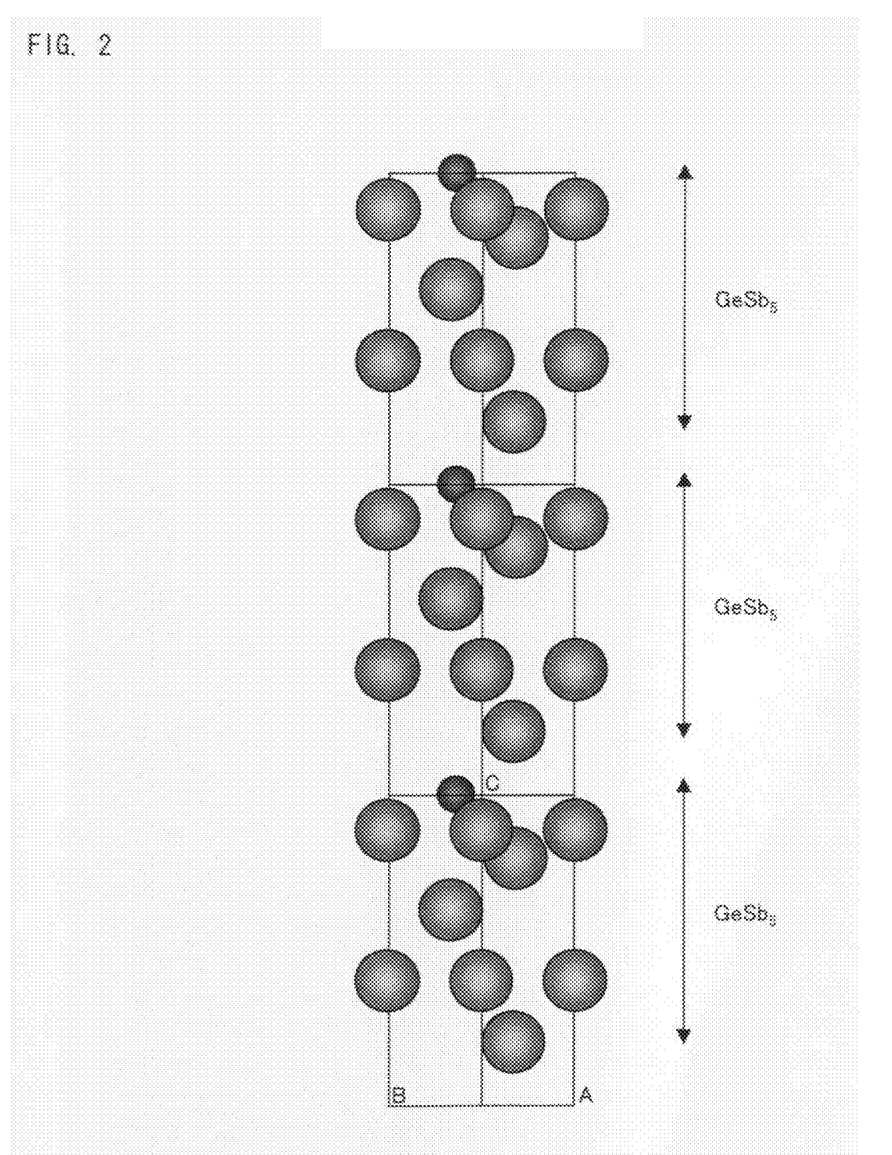
FIG. 2 is a view of the superlattice structure constituted by Ge/$Sb_5$ in accordance with an embodiment of the present invention, the view illustrating the superlattice structure which has been subjected to a phase separation.

A switching mechanism of the recording layer of the solid-state memory in accordance with the present embodiment will be described below by presenting, as an example, a recording layer having a composition of $Ge_1Sb_5$, with reference to FIGS. 1 and 2. FIG. 1 is a view of a superlattice structure constituted by Ge/$Sb_5$, the view illustrating the superlattice structure which has not been subjected to a phase separation. FIG. 2 is a view of a superlattice structure constituted by Ge/$Sb_5$, the view illustrating the superlattice structure which has been subjected to a phase separation. Note, in FIGS. 1 and 2, that (i) the structures shown before and after the phase separation are obtained, by use of a first-principle calculation, based on a hexagonal crystal model and (ii) a lengthwise direction of the sheet, on which FIGS. 1 and 2 are illustrated, is a c-axis of the hexagonal crystal.

In FIG. 1, the Sb layers are present in respective ranges indicated by the arrows 5×Sb, and the Ge layers are present in respective ranges indicated by the arrows 1×Ge.

In FIG. 2, the Ge layers have moved to lower positions than the positions as illustrated in FIG. 1, and the Ge layers and Sb layers, which are located below the respective Ge layers, are present in respective ranges indicated by the arrows $GeSb_5$.

In the structure as illustrated in FIG. 1, the Sb layers and the Ge layers are alternately laminated so as to be adjacent to each other. Each Ge layer is bound, through weak atomic bond, to corresponding two Sb layers located above and below the each Ge layer. In this state, in a case where electric energy is supplied to the solid-state memory, the Ge atoms move in a vertical direction (i.e., the c-axial direction of the hexagonal crystal). This causes such atomic bond to be cut off only in an inter-layer direction between the each Ge layer and the corresponding Sb layers. This ultimately causes the structure illustrated in FIG. 1 to be changed into the structure illustrated in FIG. 2. That is, an interface between the each Ge layer and the corresponding Sb layers is slightly widened, so that an inter-layer separation occurs. According to the structure illustrated in FIG. 2, a high electric resistance is formed and fixed. This causes an erased (recorded) state to be formed.

Further, according to the structure illustrated in FIG. 2, in a case where electric energy is supplied to the solid-state memory, the Ge atoms move in the vertical direction (the c-axial direction of the hexagonal crystal), and the atomic bond is restored. This causes inter-layer bond between the each Ge layer and the corresponding Sb layers, and the structure illustrated in FIG. 2 is restored to the structure illustrated in FIG. 1. According to the structure illustrated in FIG. 1, the high electric resistance is restored to a low electric resistance. This causes a recorded (erased) state to be formed.

Note that the inter-layer separation between the Sb layers and the Ge layers causes a phase separation (spinodal separation) of the composition of $Ge_1Sb_5$.

Since the Ge layers and the Sb layers constitute a superlattice structure, the directions, in which the inter-layer separations occur between the above two states, are identical to each other. Because of this, supplied electric energy has coherency. This causes a great reduction in entropic energy loss. As such, it is possible to utilize large portion of supplied energy for work (work of moving the Ge atoms up and down), and it is therefore possible to reduce an amount of energy emission which is emitted as heat. Since energy efficiency during a switching operation is thus improved, it is possible to greatly improve properties of the conventional PRAM.

Further, the reduction in the entropic energy loss makes it possible to ensure the Ge atoms to move while a volume expansion rate of the laminate structure, in which the Ge layers and the Sb layers are laminated, is being kept to be 5% or less. As such, it is possible to anticipate a significant increase in the number of repeatable recording operations.

In a case where a single-layer recording film is prepared using a compound target which has a given composition ratio of Ge and Sb such as $Ge_1Sb_5$, the inter-layer separations occur in constituted micro crystallites in respective random directions that differ from micro crystallite to micro crystallite. Electric energy that is supplied to cut off inter-layer bond does not have coherency, accordingly. Because of this, a thermodynamically large amount of energy must be emitted toward a system. Further, the entropic heat loss causes an increase in the energy supplied to the recording film. Since this causes a rise in temperature of the recording film more than necessary, a volume of the entire recording film reaches 5% or more.

Next, a description will be given on film thicknesses of the Sb layer and the Ge layer in the recording layer of the solid-state memory in accordance with the present embodiment.

In the configuration illustrated in FIG. 1, the Sb layer has a film thickness of about 1.22 nm, and the Ge layer has a thickness of about 0.16 nm. The entire superlattice film in the recording layer has a film thickness of 100 nm or smaller.

Here, if a ratio of a film thickness of the Ge layer to that of the Sb layer is greater than 1:3, the Ge layer is more likely to diffuse across the Ge layer due to the repetitive recording and erasing operations. This causes a significant decrease in the number of repeatable recording and erasing operations.

In contrast, if the ratio of the film thickness of the Ge layer to that of the Sb layer is smaller than 1:20, an effect brought about only by the Sb layer is excessively intensified. That is, since the number of the Ge layers in the entire film decreases, an interface, which is indispensable for switching operation, between respective Ge layers and respective Sb layers decreases in number. As such, properties of the Sb layer itself become predominant. This reduces a difference between resistances of the entire film which are obtained before and after the phase separation. If a difference between resistances of the entire film is small while there is high noise, then (i) it is not possible to determine whether a state which is read out is caused by an OFF state of a high resistance or an ON state of a low resistance or (ii) errors such as reading error increase in reading out the state. For example, the phase-change memory is generally operated while having a difference of 2 to 3 orders of magnitude between resistances of the entire film.

Further, if the ratio of the film thickness of the Ge layer to that of the Sb layer is smaller than 1:20, then separated layers are more easily bound to each other even at a relatively low temperature of around 100° C. It follows that it becomes impossible to maintain the state in which the data is recorded (stored). This causes a deterioration in thermal durability.

Therefore, the ratio of the film thickness of the Ge layer to that of the Sb layer is preferably in a range of 1:20 to 1:3. In a case where the ratio of a film thickness of the Ge layer and that of the Sb layer falls in such a range, it is possible to provide a solid-state memory that has an improvement in the number of repeatable recording and erasing operations and has good thermal durability.

Further, according to the solid-state memory of the present embodiment, the superlattice structure constituted by the Sb layers and the Ge layers can be artificially formed by means of a conventionally known method such as sputtering. In a case where the superlattice structure is formed, for example, by means of sputtering, the superlattice structure constituted by the Sb layers and the Ge layers can be easily constituted merely by controlling film formation time, provided that a film formation rate per hour with respect to supplied electric power for the sputtering is measured in advance by use of two types of simple substance targets, i.e., an Sb target and a Ge target.

The description has been given mainly on the recording layer of the solid-state memory in the present embodiment. Note that other constituents, required for the solid-state memory of the present invention, such as an electrode and a configuration for reading and writing data from and to the memory, can employ a configuration similar to that of a conventional technique (for example, Patent Literature 1) and can be manufactured by a similar method to that of a conventional technique.

For example, a solid-state memory that is constituted by a substrate, a lower electrode, the above-described recording layer, and an upper electrode can be manufactured by (i) laminating the lower electrode on the substrate by means of sputtering or the like, (ii) laminating the recording layer on the lower electrode, and then (iii) laminating the upper electrode on the recording layer by means of sputtering or the like. Examples of the material for the electrodes (the upper electrode and the lower electrode) can encompass TiN, W, and the like. Example of the material for the substrate can encompass Si.

According to the solid-state memory of the present embodiment, the electric energy is supplied to the recording layer by supplying electric pulses from the electrodes to the recording layer. In the recording layer to which the electric pulse is supplied, a volume change occurs at a rate of change of 5% or less only in the inter-layer direction between the Ge layers and the Sb layers. This causes information to be rewritten in the recording layer.

In contrast, in the conventional solid-state memory, a volume change occurs at a rate of change of about 10% during a phase transition from crystal to amorphous or vice versa. Further, a direction in which the volume change occurs is not fixed.

Note that the volume change rate is obtained by the first-principle calculation.

Therefore, with the solid-state memory of the present embodiment, it is possible to increase the number of repeatable recording and reading operations because deformation of the recording layer can be suppressed as compared with the conventional solid-state memories. Further, since the volume change of the laminated structure only occurs in a single direction, it is possible to provide stable repetitive recording operations without causing compositional segregation.

EXAMPLES

The present invention will be described below in more detail based on examples. Note that the present invention is not limited to the examples below.

Example 1

A phase-separation RAM was prepared on a silicon substrate based on a basic configuration of a general self-resistance heating-type.

A helicon sputtering device was used to prepare each layer of the phase-separation RAM. Three targets can be used in the helicon sputtering device. In this example, targets of Ge, Sb, and TiN each having a diameter of 2 inch were used as the three targets.

First, TiN having a thickness of 40 nm was deposited as the lower electrode. 20 layers of superlattices of [Ge/5Sb] were laminated, as the recording film, on the lower electrode.

The electrode and the recording film were specifically prepared by the following method. Namely, highly purified argon gas was introduced into the helicon sputtering device while maintaining a pressure of 0.4 Gpa. Subsequently, high-frequency power of 30 W, 13 W, and 150 W were supplied, at 13.56 MHz, to the targets Ge, Sb, and TiN, respectively. Time periods required for depositing films of Ge, Sb, and TiN were calculated based on respective relational expressions (linear expressions) of deposition time periods and film thicknesses. Then, (i) each shutter provided directly above a corresponding one of the three targets and (ii) a shutter provided on a holder which fixed a deposition substrate, were alternately opened and closed. A lower electrode film and a superlattice film were thus prepared. Note that a deposition temperature was 250° C.

A change in film thickness per hour was measured with respect to each of the layers by means of step profile measurement equipment, and an increasing amount of film thickness per second was calculated. As a result, it was estimated that the entire superlattice thus prepared had a film thickness of 21.50 nm. A cell size was $(100 \times 100)$ nm$^2$. On the super lattice thus prepared, an upper electrode of 40 nm was deposited by using the TiN target while maintaining the vacuum state. Measurement cells of the phase-separation RAM were prepared by means of normal lithography.

A voltage was applied in a programmed manner to a prepared device so that currents flowing the device were measured during recording and erasing. According to the measurement, a current and pulse time were 1.8 mA and 5 ns, respectively, during the recording. A current and pulse time were 0.3 mA and 30 ns, respectively, during the erasing. The number of repetitive recording and erasing operations was measured by applying these currents and pulse time, and the number thus measured was $10^8$.

Further, structures, showing before and after the phase separation in a hexagonal crystal model, were calculated based on the first-principle calculation. The calculation revealed that (i) an interface between each Ge atom layer and corresponding Sb atom layers was slightly widened in the structure showing after the phase separation as compared with that in the structure showing before the phase separation and (ii) the structure showing after the phase separation had a change in volume at a change rate of 2% in the C-axial direction.

Reference Example 1

In a manner similar to Example 1, a PRAM was prepared, based on a basic configuration of a general self-resistance heating-type. A single-layer film of GeSb$_5$ was deposited as the recording film by simultaneously using a plurality of Ge targets and a plurality of Sb targets. The GeSb$_5$ had a film thickness of 20.00 nm. A cell size was $(100 \times 100)$ nm$^2$, just as the example 1. A comparative sample was prepared by causing an upper electrode and a lower electrode and the like to be all made identical to those of the example 1.

A voltage was applied in a programmed manner to the device of Reference Example 1 so that currents flowing the device were measured during recording and erasing. The pulse application time was the same as Example 1. According to the measurement, a current was 8.6 mA during the recording. A current was 6.5 mA during the erasing. The number of repetitive recording and erasing operations was measured by applying these currents and pulse time, and the number thus measured was $10^5$.

As described above, the solid-state memory of the present embodiment can significantly reduce the currents during recording and erasing of data, as compared with those in the conventional PRAM. In especial, the solid-state memory of the present embodiment can reduce the current during erasing of data up to one tenth of that in the conventional PRAM. Further, the solid-state memory of the present embodiment can have a double- to triple-digit increase in the number of repeatable rewriting as compared with that in the conventional PRAM.

The present invention is not limited to the embodiments but allows various modifications within the scope of the claims. Any embodiment obtained by appropriately combining the technical means disclosed in the different embodiments will also be included in the technical scope of the present invention.

Industrial Applicability

The solid-state memory of the present invention is suitably applicable to a solid-state memory that requires a lower current during recording and erasing of data and that can repeatedly rewrite the data an increased number of times.

The invention claim is:

1. A solid-state memory comprising:
a recording layer in which data is recorded or erased,
the recording layer including a laminated structure in which electric properties are changed in response to a phase separation,
the laminated structure including a first layer containing an Sb atom(s) and a second layer containing a Ge atom(s), which layers are laminated so as to constitute a superlattice structure, wherein the second layer is constituted by an atomic layer having five or less Ge atoms, and the first layer is constituted by an atomic layer having an odd number of Sb atom(s).

2. A solid-state memory of claim 1, further comprising:
electrodes provided above and below the recording layer,
the data being recorded or erased by causing an electric pulse to be applied to the recording layer via the electrodes so that a volume of the recording layer is changed at a volume change rate of 5% or less in a vertical direction.

3. The solid-state memory of claim 1, wherein a ratio of a film thickness of the second layer to a film thickness of the first layer is in a range of 1:20 to 1:3.

4. A solid-state memory of claim 3, further comprising:
electrodes provided above and below the recording layer,
the data being recorded or erased by causing an electric pulse to be applied to the recording layer via the electrodes so that a volume of the recording layer is changed at a volume change rate of 5% or less in a vertical direction.

5. The solid-state memory of claim 1, wherein the first layer and the second layer are provided adjacent to each other in the laminated structure.

6. A solid-state memory of claim 5, further comprising:
electrodes provided above and below the recording layer,
the data being recorded or erased by causing an electric pulse to be applied to the recording layer via the electrodes so that a volume of the recording layer is changed at a volume change rate of 5% or less in a vertical direction.

7. The solid-state memory of claim 5, wherein a ratio of a film thickness of the second layer to a film thickness of the first layer is in a range of 1:20 to 1:3.

8. A solid-state memory of claim 7, further comprising:
electrodes provided above and below the recording layer,
the data being recorded or erased by causing an electric pulse to be applied to the recording layer via the electrodes so that a volume of the recording layer is changed at a volume change rate of 5% or less in a vertical direction.

* * * * *